(12) United States Patent
Grňo

(10) Patent No.: US 10,732,208 B2
(45) Date of Patent: Aug. 4, 2020

(54) FLEXIBLE CURRENT SENSOR WITH STRANDED CORE

(71) Applicant: Ladislav Grňo, Bratislava (SK)

(72) Inventor: Ladislav Grňo, Bratislava (SK)

( * ) Notice: Subject to any disclaimer, the term of this patent is extended or adjusted under 35 U.S.C. 154(b) by 0 days.

(21) Appl. No.: 16/477,997

(22) PCT Filed: Jan. 24, 2018

(86) PCT No.: PCT/SK2018/050002
§ 371 (c)(1),
(2) Date: Jul. 15, 2019

(87) PCT Pub. No.: WO2018/147814
PCT Pub. Date: Aug. 16, 2018

(65) Prior Publication Data
US 2020/0124644 A1    Apr. 23, 2020

(30) Foreign Application Priority Data

Feb. 13, 2017    (SK) .................................. 50008-2017

(51) Int. Cl.
*G01R 33/04*    (2006.01)
*G01R 15/18*    (2006.01)

(52) U.S. Cl.
CPC .................................. *G01R 15/181* (2013.01)

(58) Field of Classification Search
CPC .. G01R 15/181; G01R 15/185; G01R 15/246; H01F 38/30; H01F 38/40
See application file for complete search history.

(56) References Cited

U.S. PATENT DOCUMENTS

| 4,689,546 A | 8/1987 | Stephens et al. ............... 322/99 |
| 5,442,280 A | 8/1995 | Baudart ........................ 324/127 |
| 6,313,623 B1 | 11/2001 | Kojovic et al. ............... 324/127 |
| 6,825,650 B1 | 11/2004 | McCormack et al. ........ 324/127 |
| 7,847,543 B2 | 12/2010 | Grňo ............................. 324/253 |
| 10,512,510 B2 * | 12/2019 | Blumenkranz ........ A61B 34/20 |
| 2003/0090356 A1 | 5/2003 | Saito et al. ................... 336/213 |

(Continued)

FOREIGN PATENT DOCUMENTS

| DE | 198 11 366 A1 | 9/1999 |
| EP | 0 652 441 A1 | 5/1995 |
| EP | 0 834 745 A2 | 4/1998 |

(Continued)

OTHER PUBLICATIONS

International Search Report dated May 14, 2018 in corresponding PCT International Application No. PCT/SK2018/050002.

(Continued)

*Primary Examiner* — Minh N Tang
(74) *Attorney, Agent, or Firm* — Ostrolenk Faber LLP

(57) ABSTRACT

A flexible current sensor comprising a sensing coil wound on a cylindrical flexible core where the sensing coil comprises two in series connected overlapping windings wound along the cylindrical flexible core in mutually opposite direction. The cylindrical flexible core comprises a plurality of individual fibers from a nonmagnetic material arranged into the nearest approximation of a cylindrical shape and the sensing coil is equipped with a nonconductive separation layer located between its windings.

4 Claims, 1 Drawing Sheet

(56) References Cited

U.S. PATENT DOCUMENTS

2005/0248430 A1* 11/2005 Dupraz ............... G01R 15/181
336/200

FOREIGN PATENT DOCUMENTS

| | | |
|---|---|---|
| EP | 3 015 871 A1 | 5/2016 |
| GB | 2 332 784 A | 6/1999 |
| GB | 2 342 783 A | 4/2000 |
| JP | 2000-065866 A | 3/2000 |

OTHER PUBLICATIONS

Written Opinion dated May 14, 2018 in corresponding PCT International Application No. PCT/SK2018/050002.
P.N. Murgatroyd et al. "Making Rogowski coils," Measurement Science and Technology, vol. 2, No. 12, pp. 1218-1219, Dec. 1, 1991.

* cited by examiner

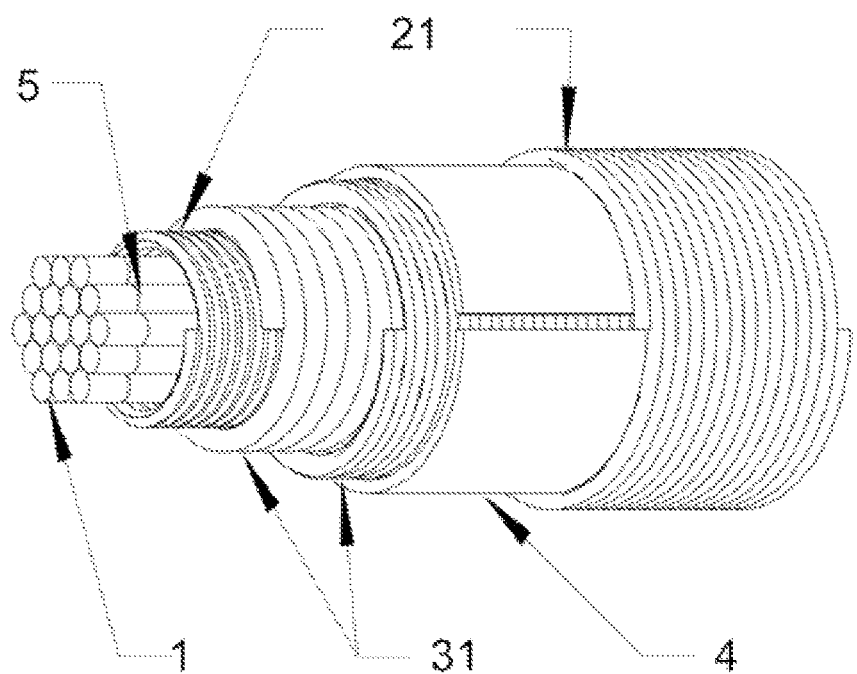

FLEXIBLE CURRENT SENSOR WITH STRANDED CORE

CROSS-REFERENCE TO RELATED APPLICATIONS

The present application is a 35 U.S.C. §§ 371 national phase conversion of PCT/SK2018/050002, filed Jan. 24, 2018, which claims priority to Slovakia Patent Application No. PP 50008-2017, filed Feb. 13, 2017, the contents of which are incorporated herein by reference. The PCT International Application was published in the English language.

TECHNICAL FIELD

The invention is related to a sensor circuit for electrical alternating current. More particularly, the invention is directed to an improvement of a flexible current sensor.

BACKGROUND OF THE INVENTION

Flexible current sensors are based on a flexible inductive coil which can be formed to create a closed path around a measured current carrying conductor. Voltage induced into the coil is proportional to the derivation of the total current flowing through the enclosed area. This principle of current measurement is well known as Rogowski principle or a Rogowski coil following the publication by W. Rogowski and W. Steinhaus in 1912. Flexible sensors are advantageous for current measurement in large size wires, difficult shape conductors and conductor groups.

Generally, a flexible current sensor has a form of a sensing cable equipped with a mechanical coupling system for either fixing or releasing the said sensor cable ends to and from the mutually closed position. The sensing cable comprises a sensing coil wound on a cylindrical flexible nonmagnetic core. The accuracy of flexible current sensors is significantly affected by stability sensor coil inductance. Beside winding density, the coil inductance is mainly affected by the accuracy and stability of the nonmagnetic core cross-sectional area.

Relevant solutions for Rogowski coil arrangements and their respective electronics can be found in following references:

U.S. Pat. No. 4,689,546 (Stephens et al) discloses an arrangement of plurality of classic single-coil flexible Rogowski sensors with a conventional metallic shield. Two individual sensor coils wound as bifilar are differentially interconnected and the output signal is conditioned with a differential amplifier in order to sense the power generator error current. This arrangement in the form of air-core current transformers disposed over conductors of a three-phase generator serves as a current monitoring equipment for generator control system.

U.S. Pat. No. 5,442,280 discloses fixed Rogowski coil arrangements on a printed circuit layout, European Patent EP652441A1 discloses fixed Rogowski coil arrangements for installations with an earthed metal casing, European Patent EP0834745A2 discloses an arrangement of a fixed Rogowski coil with high homogenity, Japanese patent JP2000065866 discloses a multiple Rogowski coil arrangement for the measurement of current flowing through large structures, UK patent application No. GB2332784A discloses flexible Rogowski coil arrangements comprising a sensor coil wrapped on a fixed support structure, German patent application No. DE19811366A1 discloses flexible Rogowski coil arrangements optimized for repeated assembling on a power line, UK patent No. GB2342783A discloses fixed Rogowski coil arrangements on a printed circuit layout, U.S. Pat. No. 6,825,650B1 discloses arrangements of series of fixed Rogowski coils for current measurement in an electricity meter, U.S. Pat. No. 6,313,623B1 discloses spatial arrangements of two Rogowski coils eliminating residual signals, US pat. Application No. US2003/0090356A1 discloses fixed Rogowski coil arrangements on a printed circuit layout with an optic transmission path.

U.S. Pat. No. 7,847,543 B2 discloses a coil winding arrangement and an electrical shielding arrangement for flexible Rogowski coil improving accuracy and independency from electrical and external magnetic fields.

Principal linearity, lack of saturation of the nonmagnetic core and a wide frequency range are inherent properties of the Rogowski current sensors which continuously invoke demand for their further improvement and application oriented optimization. The accuracy of the state of the art flexible Rogowski current sensors is still insufficient for precision metering applications.

Therefore, the object of this invention is to provide a new and improved arrangement of a Rogowski flexible current sensor yielding significant accuracy improvement.

SUMMARY OF THE INVENTION

The invention is aimed at improvement of a flexible current sensor. The flexible current sensor comprises a cylindrical flexible core equipped with a sensing coil wound on the cylindrical flexible core. The sensing coil preferably comprises two serially connected overlapping windings wound in mutually opposite direction. The invention is characterized in that the cylindrical flexible core comprises a plurality of individual fibers, i.e. thin strands with their diameter negligible compared to their length, fabricated from a nonmagnetic material arranged into nearest approximation of a cylindrical shape. The sensing coil is preferably equipped with a non-conducting separation layer located between its windings. The individual fibers of the core are covered by an isolation layer. For example, an enamel or an oxidation layer on a metallic fiber can be used as the fiber isolation layer.

The separation layer located between the sensing coil windings according to the invention comprises at least one winding from a nonmetallic fiber. In case of a plurality of separation layer windings the individual windings are wound with alternating winding directions.

The plurality of individual fibers of the flexible core improves the accuracy of cross-sectional area of the flexible core due to averaging of individual fiber diameter deviations and improves the overall flexibility of the sensor. Fibers fabricated from the metallic material ensure long term dimensional and thermal stability due to generally better mechanical and thermal properties of metal compared to flexible plastics. The linearity of the current sensor is ensured by utilizing a non-magnetic metal. The isolating layer covering individual conductive metallic wires of the core ensures mutual insulation of the wires and therefore prevents circular core current from affecting the current measurement accuracy. As a suitable nonmagnetic metal it is possible to use, for example, aluminum or copper.

The separation layer from a nonconductive material located between sensing coil windings ensures low coil capacitance and thus a wider frequency range of the sensor. Preferably, the separation layer is made from a nonmetallic fiber winding. The fiber winding ensures accurate layer thickness and a simple manufacturing process. A multilayer winding with the altered winding direction compensates the tangential moments produced by the tension of the winding fibers and this way prevents torsion of the final sensor. Preferably, a homogenization foil wrapping the winding ensures a smooth base for accurate winding of the next layer and thus improves the final accuracy and the long-term stability.

BRIEF DESCRIPTION OF THE FIGURE

The accompanying FIGURE illustrates an embodiment of the present invention with a flexible core (1) comprising a plurality of individual fibers (1); an isolation layer (5) covering the individual fibers; windings of a sensing coil (21); windings of a separation layer (31); and a homogenization foil (4).

DETAILED DESCRIPTION

An Example of a Possible Embodiment

The presented example is provided for the purpose of illustration only. Those skilled in the art can suggest plurality of modifications of the presented solution which are covered by the claims.

Example

The presented FIGURE shows a flexible current sensor with a flexible core 1 comprising a plurality of individual fibers from a nonmagnetic material arranged into the nearest hexagonal approximation of a cylindrical shape. A sensing coil 21 comprises an overlapping winding pair wound on the core. Two individual windings of the pair are wound in mutually opposite directions. The separation layer 31 is made of two windings of a nonmetallic fiber wound with mutually opposite directions between the windings of the sensing coil 21. The homogenization foil 4 wrapping the upper winding of the separation layer 31 enables smooth and accurate winding of the outer winding of the sensing coil 21. Each individual fiber of the flexible core 1 is fabricated from a nonmagnetic metallic material and is covered by an isolation layer 5. An enameled copper wire is used in this example as the nonmagnetic metallic material.

INDUSTRIAL APPLICABILITY

The presented invention is aimed at utilization in control and monitoring systems in various industrial application where an accurate measurement of electrical current, including its DC content, is expected.

The invention claimed is:

1. A flexible current sensor comprising a sensing coil wound on a cylindrical flexible core, wherein said sensing coil comprises two overlapping in series connected windings wound along said cylindrical flexible core in mutually opposite direction, wherein said cylindrical flexible core comprises a plurality of individual fibers from a nonmagnetic material arranged into the nearest approximation of a cylindrical shape and the sensing coil is further equipped with a separation layer located between its windings; wherein each of said plurality of individual fibers of the cylindrical flexible core from the nonmagnetic metallic material is covered by an insulating layer and said plurality of individual fibers of the cylindrical flexible core are mutually insulated.

2. The flexible current sensor according to claim 1, wherein said separation layer located between said windings of said sensing coil comprises at least one winding from a nonmetallic fiber.

3. The flexible current sensor according to claim 2, wherein said separation layer comprises multiple windings from nonmetallic fiber wound with an altered winding direction.

4. The flexible current sensor according to claim 1, wherein at least one winding of said sensing coil is wrapped with a homogenization foil.

\* \* \* \* \*